(12) United States Patent
Haba

(10) Patent No.: US 6,378,758 B1
(45) Date of Patent: Apr. 30, 2002

(54) CONDUCTIVE LEADS WITH NON-WETTABLE SURFACES

(75) Inventor: Belgacem Haba, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/233,586

(22) Filed: Jan. 19, 1999

(51) Int. Cl.[7] .......................... B23K 31/02; B23K 35/38
(52) U.S. Cl. ...................... 228/180.1; 228/180.21; 228/215; 228/219; 228/256
(58) Field of Search ................ 228/180.1, 180.21, 228/254, 245, 214, 215, 219, 256

(56) References Cited

U.S. PATENT DOCUMENTS

| | | | |
|---|---|---|---|
| 4,357,069 A | * 11/1982 | Milora | |
| 4,864,079 A | 9/1989 | Barlow | 174/52.1 |
| 5,041,901 A | 8/1991 | Kitano et al. | 357/70 |
| 5,172,852 A | 12/1992 | Bernardoni et al. | 228/180.2 |
| 5,194,137 A | 3/1993 | Moore et al. | 205/125 |
| 5,489,749 A | 2/1996 | DiStefano et al. | 174/261 |
| 5,491,302 A | 2/1996 | DiStefano et al. | 114/260 |
| 5,518,964 A | 5/1996 | DiStefano et al. | 437/209 |
| 5,619,017 A | 4/1997 | DiStefano et al. | 174/260 |
| 5,620,131 A | 4/1997 | Kane et al. | 228/215 |
| 5,688,716 A | 11/1997 | DiStefano et al. | 437/182 |
| 5,763,941 A | 6/1998 | Fjelstad | 257/669 |
| 5,798,286 A | 8/1998 | Faraci et al. | 438/113 |
| 5,804,880 A | 9/1998 | Mathew | 257/779 |
| 5,821,608 A | 10/1998 | DiStefano et al. | 257/669 |
| 5,859,472 A | 1/1999 | DiStefano et al. | 257/674 |
| 5,964,395 A | 10/1999 | Glovatsky et al. | 228/123.1 |
| 6,063,648 A | 5/2000 | Beroz et al. | 438/113 |
| 6,191,368 B1 | 2/2001 | Di Stefano et al. | |

FOREIGN PATENT DOCUMENTS

| | | | |
|---|---|---|---|
| JP | 408055946 A | * | 2/1996 |
| WO | WO87/04008 | * | 7/1987 |
| WO | WO 94/03036 | | 2/1994 |

OTHER PUBLICATIONS

*Interconnect Options*, Flexible Circuitry International, Timothy Patterson and Aria Esfandiar, Mar./Apr. 1998, pp. 9–11–18.

Di Stefano et al., U.S. Patent Application Serial No. 09/047,638, filed Mar. 25, 1998, entitled Solder Pads and Microelectronic Assemblies with Soldered Joints.

Haba, U.S. Patent Application Serial No. 09/020,750, filed Feb. 9, 1998, entitled components with releasable leads.

* cited by examiner

*Primary Examiner*—Tom Dunn
*Assistant Examiner*—Kiley Stone
(74) *Attorney, Agent, or Firm*—Lerner, David, Littenberg, Krumholz & Mentlik, LLP (57) ABSTRACT

A microelectronic connection component is provided with leads having a surface wettable by a bonding material such as a solder at the tips of the leads which are intended to be bonded with microelectronic devices. The leads have non-wettable surfaces bounding the wettable surfaces. During bonding, the non-wettable surfaces confine liquid bonding material such as liquid solder and prevent the liquid bonding material from spreading along the leads.

18 Claims, 6 Drawing Sheets

CONDUCTIVE LEADS WITH NON-WETTABLE SURFACES

BACKGROUND OF THE INVENTION

The present invention relates to the art of microelectronics, and more particularly relates to leads and lead bonding methods suitable for forming electrical connections to microelectronic devices.

Microelectronic devices such as semiconductor chips and microelectronic circuit panels can be connected to one another by a variety of methods. In wire bonding, a component such as a semiconductor chip having contact on a front surface typically is disposed on the top or contact bearing surface of a circuit panel. The front surface of the chip having contacts thereon faces upwardly, away from the circuit panel. Fine wires are connected between the contacts on the chip and the contacts on the circuit panel by processes such thermosonic ball or wedge bonding.

In flip-chip bonding, the chip or other device is provided with its contact-bearing surface facing the contact-bearing surface of the circuit panel, so that each contact on the chip is aligned with a corresponding contact on the circuit panel. Individual solder masses are provided at each pair of aligned contacts and melted or "reflowed" so that the solder wets the contacts on the chip and on the circuit, whereupon the assembly is cooled to solidify the solder and form permanent connections. In tape automated bonding, a flexible film or "tape" is provided with contact pads and with leads extending from the contact pads. The leads are arranged in a pattern corresponding to the contacts on the chip. The tape is placed over the chip and the individual leads are bonded to individual contacts on the chip. The resulting assembly can be bonded to a circuit panel by a process similar to that employed in flip-chip bonding. Thus, each contact pad of the tape is aligned with the corresponding contact on the circuit panel and a solder mass is provided between each pair of aligned contacts and reflowed to form a permanent connection.

As described in certain embodiments in certain U.S. Pat. No. 5,518,964, the disclosure of which is incorporated by reference herein, a connection to a microelectronic element such a semiconductor chip can be made by providing a connection component with a support structure such as dielectric layer and with a plurality of leads extending along a bottom surface of the support structure. Each lead has a terminal end permanently attached to the support structure and a tip end releasably attached to the support structure. The tip ends of the leads are arranged in a pattern corresponding to the pattern of contact on the microelectronic device. Typically, each lead has a mass of a bonding material such as a eutectic bonding alloy or solder at its tip end. The connection component is engaged with the microelectronic device so that the tip ends of the leads engage the contacts on the device. While the tip ends of the leads are engaged with the contacts on the device, the bonding material is activated, as by heating, to form a liquid phase at the interfaces between the tip ends of the leads and the contacts on the device. This liquid phase solidifies to form a permanent bond between the tip end of each lead and the associated contact. For example, where the bonding material is a eutectic bonding alloy, the alloy liquefies at a relatively low temperature when the assembly is heated during the bonding process. However, diffusion between the liquid phase and the adjacent solid phases of the lead and contact changes the composition of the eutectic alloy and raises its melting temperature to above the prevailing temperature, whereupon the liquid phase solidifies. Where the bonding material is a solder, the liquid phase forms when the assembly is heated to above the melting temperature of the solder and solidifies when the assembly is cooled to below the melting temperature of the solder.

In preferred embodiments according to the '964 patent, after the tip ends of the leads are bonded to the contacts, the support structure and the device are moved away from one another so as to bend the tip ends of the leads away from the support structure of the connection component and thereby deform the leads to a vertically-extensive disposition. In this disposition, the leads are flexible. A dielectric material such as a compliant encapsulant may be provided between the support structure and the device, as by injecting a curable liquid material during or after the moving step. In variants of the processes taught by the '964 patent, the bonding material can be carried on the contacts of the chip or other device, rather than on the tip ends of the leads. Preferred processes according to the '964 patent provide extraordinarily useful methods for making connections. Merely by way of example, these processes can be used to connect all of the chips on a wafer to terminals or other conductive features on a support structure in a few steps. After these connections are made, the wafer and the support structure can be severed to provide individual units, each including one or more chips and the associated portions of the support structure.

Despite these and other developments in the art, still further improvement in processes using bonding materials to connect leads and contacts would be desirable. Improvements in components used in such processes also would be desirable.

SUMMARY OF THE INVENTION

One aspect of the present invention provides components for use in microelectronics. A component according to this aspect of the invention has a support structure as, for example, a dielectric element or an active electronic device such as a semiconductor chip or semiconductor wafer. The component also includes a plurality of leads. Each lead has a lead structure including a main region and a tip region which can be moved with respect to the support structure. The lead structure has a wettable surface in the tip region and a non-wettable surface bounding the wettable surface. The wettable surface is wettable by a liquid bonding material, whereas the non-wettable surface is not. Therefore, when the tip region of the lead is exposed to a liquid bonding material, the liquid bonding material wets the tip region but it does not spread from the tip region onto the main region. The lead may have a mass of solid bonding material on the tip region. The bonding material is adapted to form a liquid which wets the wettable surface but which does not wet the non-wettable surface.

For example, the lead structure may include a metal such as copper and the non-wettable surface may be formed from a compound of the metal such as a copper oxide. In one particularly preferred arrangement, the wettable surface is defined by an oxidation resistant metal such as a metal selected from the group consisting of gold, platinum and alloys thereof. The bonding material may a solder or may include a eutectic-forming metal adapted to form a low-melting eutectic with surrounding metals. Other bonding materials may be employed. In use, the leads can be bonded to contacts on a microelectronic device by engaging the tip ends of the leads with the contacts and heating the assembly. The bonding material forms a liquid phase which wets the tip end of the lead and which also wets the contact. This liquid phase however does not spread along the length of the lead. Instead, the liquid phase is confined at the tip of the lead by the non-wettable surface. Confinement of the liquid bonding material to the tip end of the lead produces several desirable results. First, because the liquid remains at the tip end of the leads, it is available to form the desired bond with the contact on the device. Also, the liquid bonding material cannot embrittle regions of the lead outside of the tip region. This advantage is significant because regions of the lead outside of the bond typically are exposed to greater flexural fatigue stresses during service.

Desirably, the main region of each lead includes an anchor end remote from the tip end, the anchor end of each lead being attached to the support structure. The connection between the anchor and the support structure may be the sole connection between each lead and the support structure. Alternatively, the tips of the leads or regions of the leads adjacent the tip ends may be releasably attached to the support structure.

A further aspect of the invention provides methods of making microelectronic connections. A method according to this aspect of the invention includes the step of engaging the tip ends of one or more leads with one or more contacts on a microelectronic component. Here again, the leads have a wettable surface at the tip ends and a non-wettable surface bonding the tip ends. A liquid bonding material is provided at the engaged tip ends and contacts. The liquid bonding material wets the tip ends of the leads and the contacts, but the non-wettable surfaces on the leads confine the liquid bonding material and prevent the liquid bonding material from spreading along the leads from the tip ends. The liquid bonding material is then solidified. For example, where the bonding material includes a eutectic-forming material, the solidification may occur by diffusion between the liquid bonding material and the surrounding solid phases. Where the liquid bonding material includes solder, the solidification may occur upon cooling of the assembly.

The step of providing the liquid bonding material may be performed by providing the bonding material on the tip ends of the leads prior to engaging the tip ends of the leads with the contacts and activating the solid bonding material by heating the assembly while the tip ends are engaged with the contacts. Alternatively or additionally, solid bonding material may be provided on the contacts prior to engagement, and this bonding material also may be activated by heating the assembly while the tip ends of the leads are engaged with the contacts. In yet another alternative, the bonding material may be applied while the tip ends of the leads are engaged with the contacts.

Typically, the leads are provided on a component including a plurality of the leads. Each of the foregoing steps is performed simultaneously for the plurality of leads. For example, plural leads on a single component may be engaged with a semiconductor chip; with a plurality of separate semiconductor chips or with a plurality of semiconductor chips in the form of a unitary wafer so that numerous lead tip ends are engaged with the numerous contacts simultaneously. The methods according to this aspect of the invention provide advantages as discussed above in connection with the components. Thus, here again, confinement of the liquid bonding material improves the strength of the joints between the tip ends of the leads and the contacts, and keeps the bonding material away from the structure of the lead in regions remote from the tips, so that the bonding material does not embrittle the structure.

Yet another aspect of the invention provides methods of making leads. A method in accordance with this aspect of the invention is performed with a lead structure formed in whole or in part from one or more structural metals and including both a tip region and a main region. The method includes the step of treating the main region of the structure to form a surface layer thereon which is non-wettable by a liquid bonding material while leaving at least a portion of the tip region without such nonwettable surface layer and with a surface, wettable by the liquid bonding material. The method may further include the step of applying bonding material adapted to form a liquid phase to the wettable surface in the tip region. The non-wettable surface desirably confines the bonding material to the tip end of the lead when the bonding material is applied.

In one arrangement, the step of treating the main region of the surface includes the step of contacting the main region of the surface with one or more reactants so that the reactants react with one or more of the structural metals in the lead to form the non-wettable surface layer. The method according to this aspect of the invention may further include the step of applying a cover layer on the tip region so as to protect the tip region from the reactant. The cover layer desirably is substantially nonreactive with the reactant under the conditions used in the contacting step. Preferably, the cover layer is an electrically conductive material such as an oxidation-resistant metal as discussed above and the reactant is an oxygen-containing reagent such as an oxygen-bearing plasma, air or other oxygen-containing gas. The cover layer performs a double function: it protects the tip ends of the leads from oxidation or other reactive processing used to form the non-wettable surface on the main region of the lead, and also provides a wettable surface on the tip region of the lead. Methods according to this aspect of the invention can be used to form leads and components as discussed above.

These and other objects, features and advantages of the invention will be more readily apparent from the detailed description of the preferred embodiments set forth below, taken in conjunction with the accompanying drawings.

DETAILED DESCRIPTION OF THE PREFERRED EMBODIMENTS

A component according to one embodiment of the invention includes a support structure 20 (FIGS. 1 and 2) and a plurality of leads 22 disposed on a bottom surface 21 of support structure 20. Each lead 22 has an elongated main region 24, a tip end 26 at one end of the main region and an anchor end 28 at the opposite end of the main region. The anchor end 28 of each lead is permanently secured to the support structure as, for example, by a via 30 extending into or through the support structure. The particular support structure 20 is adapted to maintain leads 22 electrically isolated from one another. Support structure 20 includes a simple sheet of a polymeric dielectric material such as polyimide. As described in greater detail in the aforementioned '964 patent, however, the support structure may include additional elements such as conductive traces extending in horizontal directions along one or both surfaces of the support structure or within the support structure. Also, the support structure may include electrically conductive potential plane elements such as ground planes or power planes. The support structure may be a multi-layered structure including various layers of dielectric materials, traces and/or potential plane elements. Also, the support structure need not be formed from a polymeric material but instead may be formed from other dielectrics, with or without conductive features. As further discussed below, other components in accordance with the invention include entirely different types of support structures such as semiconductor chips or wafers. Thus, the term "support structure" as used in the present application should not be understood as implying any requirement for particular types of materials or internal arrangement.

Figure 1:
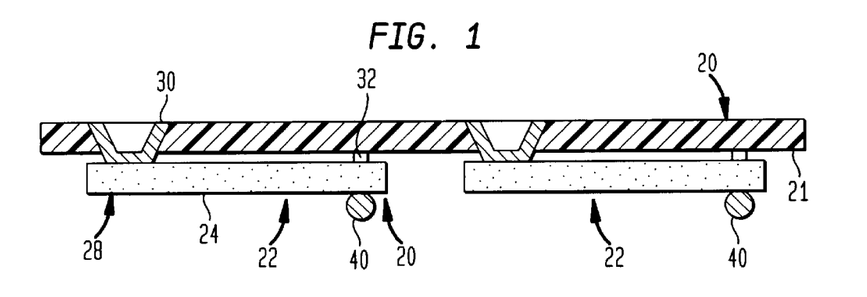
FIG. 1 is a fragmentary, diagrammatic sectional view depicting portions of a component according to one embodiment of the invention.
Figure 2:
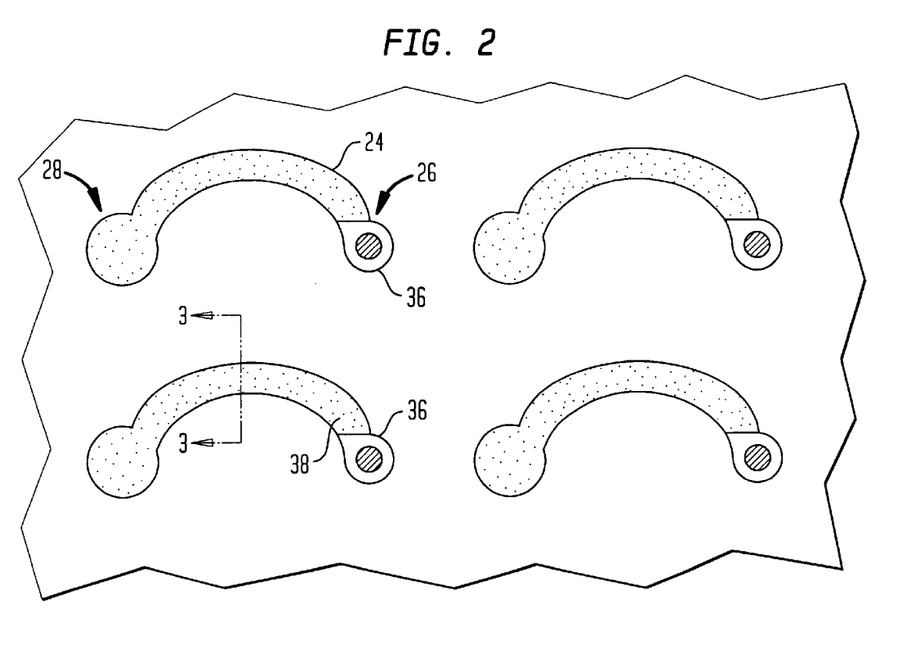
FIG. 2 is a fragmentary bottom plan view of the component depicted in FIG. 1.

The tip end 26 of each lead is releasably secured to the support structure. These features of the lead may be made in accordance with the aforementioned U.S. Pat. No. 5,518,964. As disclosed in certain embodiments of the '964 patent, the tip ends 26 of the leads may be secured to the support structure by small posts 32 disposed between the bottom surface of the support structure and the lead itself at the tip ends. As described in greater detail in certain embodiments of the '964 patent, such posts may be made by forming a bulbous portion at the tip end of each lead and etching away a metal disposed between the lead and the support structure. As described in copending, commonly assigned U.S. patent application 09/020,750, filed Feb. 9, 1998 the disclosure of which is hereby incorporated by reference herein, leads with releasable tip ends may also be made by etching the polymeric material of the support structure. In still other arrangements, as disclosed in U.S. Pat. No. 5,763,941, the disclosure of which is also incorporated by reference herein, a readily peelable release interface may be provided beneath the tip end of the lead, whereas a stronger bond may be provided between the anchor end of the lead and the support structure.

Each lead 22 has a solder-wettable surface 36 covering a tip region of the lead at the tip end 26. The solder-wettable surface of the tip region covers the bottom side of the tip end, i.e., the side of the tip end facing away from the support structure. Each lead also has a non-solder-wettable surface 38, shown as a darkened surface color in FIGS. 1, 2, 4 and 5, covering the remainder of the exposed lead surfaces. The non-solder-wettable surface 38 thus bounds the solder-wettable surface 36 at the juncture between the tip end 26 and the main region 24 of the lead.

Figure 3:
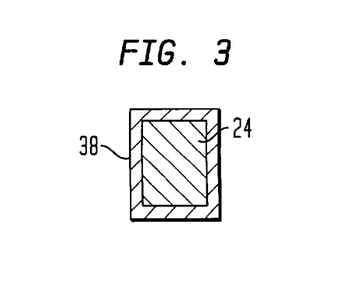
FIG. 3 is a diagrammatic sectional view along line 3—3 in FIG. 2.

The solder-wettable surface 36 may be formed from essentially any solder-wettable metal. However, metals resistant to oxidation during fabrication and storage are preferred. Among the preferred solder-wettable metals are gold, platinum and alloys thereof, gold being most preferred. The non-solder wettable surface 38 can be formed from a wide variety of materials. For example, as seen in FIG. 3, the structural components of the lead, such as the main portion 24 may be formed from a metal, whereas the non-wettable surface 38 may include a layer of a metal compound overlying the structural metal of the lead. For example, the compound may be a metal oxide, metal nitride or metal halide, or a combination of these. In a particularly preferred arrangement, the metal compound is formed from the metal of the lead itself. For example, where the structural metal of the lead is copper or a copper alloy, the metal compound may include copper oxide. In forming such a metal compound layer, the main region and other areas where the non-wettable surface is desired are exposed to a reactant containing oxygen, nitrogen, halogens or mixtures thereof while the tip region is protected by a cover layer so that the non-wettable metal compound is not formed in the tip region. If the cover layer is an electrically conductive, solder-wettable material, the cover layer may remain in place and may serve as the solder-wettable surface. For example, where the solder-wettable layer is formed from an oxidation-resistant metal, the oxidation-resistant metal may be deposited on the tip regions prior to exposing the support structure, with the leads thereon to the reactant. Alternatively, the cover layer which protects the tip regions may be a mask such as a photoresist which is stripped off after the leads have been contacted with the reactant.

Exposure to the reactant can be conducted under any conditions sufficient to form the non-wettable surface layer. For example, the exposure to a gaseous reactant can be conducted in an electrical discharge sufficient to convert the gaseous reactant to a plasma containing monatomic oxygen, monatomic nitrogen, free radicals or other highly active transient species. As described the aforementioned U.S. patent No. application Ser. No. 091020,750, the polymeric surface of the support structure may be etched by exposing the support structure, with the leads thereon, to a plasma. The cleaning step which is used after etching the polymer may also serve to form the non-wettable surfaces on the leads. In certain processes according to the '750 application, the polymeric surface is etched by a plasma containing fluorine and oxygen, such as a plasma formed from 70% $CF_4$ and 30% $O_2$. The etching procedure leaves a residue on the metallic leads, which is removed by exposure to a pure oxygen plasma, typically for about 5 minutes. Where the leads have exposed copper surfaces, such a treatment will form copper oxide layers on the leads.

Instead of exposing the component directly to a plasma, a gaseous reactant can be converted into transient species in a separate plasma reactor and the resulting transient species or so-called "plasma afterglow" can be directed onto the connection component. In yet another alternative, the components can be exposed to the gaseous reactant without conversion to a plasma as, for example, by holding the component in the gaseous reactant at an elevated temperature. In a less preferred arrangement, the component can simply be left to react with an oxygen containing reactant such as atmospheric air at room temperature for a sufficient time for a non-wettable surface to develop.

Desirably, the metal compound is formed as the thinnest possible layer sufficient to resist wetting by the bonding material so that the metal compound does not appreciably embrittle the lead and does not appreciably reduce the cross-sectional area of the metal portion of the lead. Thus, the relative thickness of the metal compound layer 38 is greatly exaggerated in FIG. 3. In practice, the metal compound layer desirably is less than about less than 0.1 micron (1000Å) and more desirably less than 100Å thick. In a further alternative, the metal compound layer may be formed by exposing the metal of the lead to a liquid reactant in an anodization procedure.

In yet another alternative, the non-wettable surface may be formed from a metal such as a metal selected from the group consisting of nickel, chromium, rhodium, osmium and combinations thereof. For example, where the structural metal of the lead is copper, gold, platinum or other solder-wettable metal, a non-solder wettable metal may be deposited onto the surface of the structural metal in regions other than tip region 36, leaving the tip regions 36 with a solder wettable surface and leaving the remainder of the lead with a non-solder wettable surface formed by the metal. Alternatively, the non-wettable metal may be deposited on the entirety of the lead and then covered with a spot of wettable metal in the tip region. In yet a further alternative, the structural metal of the lead itself may be a non-wettable metal and the wettable metal may be provided on the tip region. The metals can be deposited using known processes such electroplating, electroless plating or combinations thereof.

In yet another variant, the non-wettable layer may be formed from a dielectric material such as a polymer deposited onto the lead surfaces by an electrophoretic deposition process. Electrophoretic deposition processes and materials for use in deposition mixtures are well known in the coating arts. For example, materials for applying an acrylic polymer are sold under the designation Powercron cationic acrylic (900—900 series) by the PPG Company. Materials for applying epoxy coating are sold under the designation Powercron cationic epoxy (400–600 series) by the same vendor. In an electrophoretic deposition process, the conductive element to be coated is immersed in a bath containing the polymer, and a counterelectrode is also in contact with the bath. A potential applied between the counterelectrode and the part to be coated causes the polymer to deposit on the part. Typically, the counter electrode is larger than the area to be covered by the coating and the current density during the electrophoretic deposition step desirably is maintained below about 1 milliampere per centimeter of coated area so as to minimize formation of defects in the deposited coating. The current may be substantially constant during the process. The applied potential may be on the order of about 100 volts and typically is applied for a few minutes or more. After the electrophoretic deposition step, the part is removed from the deposition bath, washed to remove cleaning undeposited deposition solution and then baked to cure the coating to a solid form. Other processes for depositing a polymer coating may be employed as, for example, dipping or spraying in a curable coating material such as an epoxy, urethane, lacquer or plastisol to form an adherent liquid film and then curing the film to form a solid dielectric coating on the surfaces of the leads. Desirably, the leads are masked to avoid deposition of the polymeric coating on the tip regions.

Each of the leads has a mass of a solder 40 disposed on the tip region 36. The solder masses may be applied by placing preforms on the lead tip and then heating to reflow the solder so that the solder wets the wettable material of the tip region and the preform adheres to the tip. Alternatively, the solder masses may be formed in position by exposing the leads to a liquid solder, as for example, by momentarily contacting the leads with molten solder in a wave-soldering operation. Because only the tip regions of the leads are solder-wettable, the solder will adhere only to the tip regions and not to the remainders of the leads.

In a bonding process according to a further embodiment of the invention, the connection component of FIGS. 1–3 is engaged with an electronic device 42 (FIG. 4) having a front surface 44 with contacts 46 thereon. Terms such as "electronic device", "electronic component" and the like, as used in this disclosure, should be understood broadly as referring to any device or component useful in electronics. Examples of such devices include active semiconductor devices such as semiconductor chips and wafers, passive electronic components such as capacitors, resistors and inductors, and other electrical circuit elements such as circuit panels incorporating conductive and dielectric materials, electrical connectors and the like. The tip ends 26 of the leads are aligned with contacts 46, so that the solder masses 40 are engaged between the tip ends of the leads and the contacts. The steps of aligning the tip ends of the leads with the contacts can be performed, for example, in the manner described in the '964 patent or as described in the U.S. Pat. No. 5,789,286, the disclosure of which is incorporated by reference herein. While the tip ends are engaged with the contacts, the assembly is brought to an elevated temperature. The solder masses 40 melt, thereby providing a liquid bonding material between the tip regions 46 of the leads and the contacts. The liquid solder wets the tip regions of the leads and wets the contacts, whereupon the assembly is cooled so that the solder solidifies. While the solder is in the molten condition, it does not tend to spread along the leads. Stated another way, the non-wettable surfaces 48 of the leads serve to confine the molten bonding material between the tip regions of the leads and the contacts on the device.

Confinement of the solder in this fashion provides several significant benefits. First, because the solder does not spread along the lead, more of the solder remains in place at the tip of the lead, where the solder is needed to form a strong bond. Also, the problem of embrittlement with certain leads and solders is alleviated. For example, when a lead is formed from gold and a tin-containing solder such as a 63% lead/37% tin eutectic solder is used, the gold can form brittle intermetallic compounds with the solder. To prevent such embrittlement, the volume of gold which is available to dissolve in the solder should be limited to less than 5% of the solder volume at the joint. By confining the solder at the lead tips, the solder volume at the joint is maximized.

Figure 4:
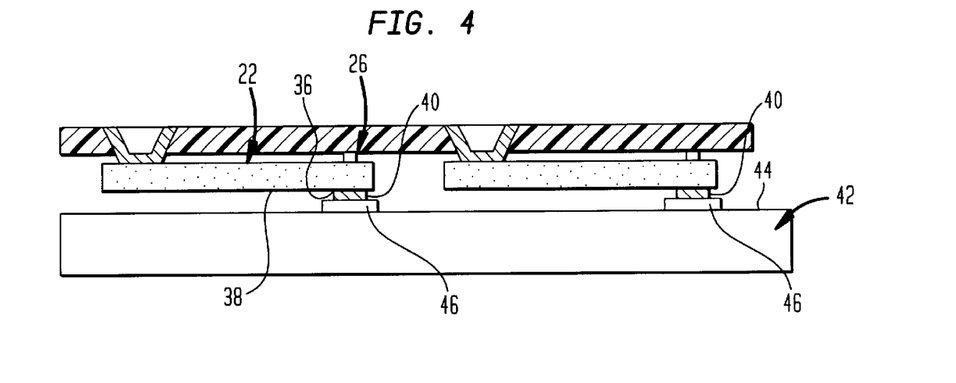
FIG. 4 is a diagrammatic sectional elevational view depicting the component of FIG. 1 in conjunction with a microelectronic device drawing a process in accordance with one embodiment of the invention.
Figure 5:
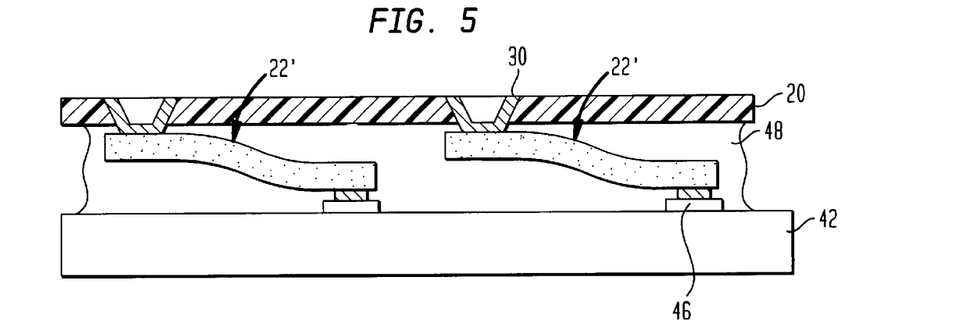
FIG. 5 is a view similar to FIG. 4 but depicting the component and device during a later stage of the process.

In the next stage of the process, support structure 20 is moved upwardly, away from device 42 so as to deform leads 22 from the flat, horizontal disposition illustrated in FIGS. 1, 2 and 4 to a more vertically extensive disposition as shown in FIG. 5. The step also may be performed generally as described in the '964 and '286 patents. As described in greater detail therein, a flowable material such as a liquid gel-forming or elastomer-forming composition 48 may be injected between the support structure and the device and cured to form a compliant encapsulant surrounding the leads. The vertically extensive, bent leads 22' provide flexibility which allows vias 30 to move with respect to contacts 46 while remaining electrically connected there. Also, the mechanical decoupling provided by the complaint material 48 allows the support structure to move with respect to the electronic device 42.

The resulting, assembled product can be used in various ways. For example, where device 42 is a wafer or other assemblage of including multiple semiconductor chips, the assembly typically is severed, as severing the wafer or other assemblage and also by severing the support structure to provide individual units, each including one or more semiconductor chips together with the associated portions of the support structure and the associated leads and vias. Alternatively, where device 42 includes a single chip, or a few chips intended to remain together in service, the assembly may be complete after formation of the compliant layer, and no further steps may be required to provide a complete, packaged assembly. Numerous variations of this general assembly process are taught in copending assigned patents, as for example, U.S. Pat. No. 5,518,964, 5,798,286 and 5,688,716, the disclosures of which are hereby incorporated by reference herein. All of these processes may be used with leads and bonding steps as discussed herein.

In a variant of the connection process discussed above, the bonding material or solder is initially provided on the contacts 46, rather on the tip regions of the leads. The solder is brought to a liquid condition while the tip regions of the leads are aligned with the contacts and while the tip regions of the leads are engaged with the solder. Whether the solder is initially disposed on the contacts of the electronic device or on the tip regions of the leads, the solder can to brought to a liquid condition before the components are assembled with one another.

Fluxless solders and fluxless soldering procedures are preferred where the non-wettable surface is an oxide layer. Fluxes typically are not used where the non-wettable surface is an oxide layer, because the flux tends to destroy the oxide non-wettable surface. However, fluxes can be used with other non-wettable surfaces. If a flux is employed in the soldering process, the flux desirably is removed before the flowable material 48 is applied.

In the bonding processes discussed above, the bonding material is a solder and hence the liquid bonding material is a molten solder. However, other bonding materials may be employed. For example, a eutectic-forming bonding material may be employed. Eutectic-forming bonding materials are adapted to form low-melting eutectic alloys with the surrounding metals when heated to a first elevated temperature, and to solidify when the composition of the alloy changes by diffusion between the molten eutectic and the surrounding metals. In this case, the wettable surface of the tip region is selected so that it is wettable by the liquid eutectic, whereas the non-wettable surface regions of the lead are selected so that they are not wettable by the liquid eutectic. Desirably, the wettable surface includes gold and the eutectic-forming alloy is selected from the group consisting of tin, germanium, silicon and combinations thereof.

Components incorporating eutectic forming alloys can be held and assembled in substantially the same manner as described above. When the tip ends of the leads are aligned with the contacts of the microelectronic device, the assembly is brought to an elevated bonding temperature, typically about 240° C. The tin or other eutectic-forming metal interdiffuses with the gold in the wettable surface region of the lead and with gold in the contacts of the microelectronic device, thereby forming a low-melting eutectic having a melting temperature below the bonding temperature. This low-melting eutectic forms a liquid bonding material. The liquid bonding material continues to dissolve the gold from the lead and from the contacts. With increasing gold content, the solidus or freezing temperature of the eutectic composition rises, and the bond solidifies. The bonding process continues with an annealing stage at a temperature sufficient to permit substantial interdifflusion between gold and tin, typically about 180° C. for about 10 minutes, so as to further enrich the bond and further strengthen the bond. Substantially the same process can be used with eutectic forming materials other than tin. Also, the eutectic forming material can be initially present on the contacts of the electronic device rather than on the leads.

In still other variants of the process, the bonding material may include a polymeric composition as, for example, a thermoplastic or thermosetting polymer composition filled with microscopic particles of a metallic material to impart conductivity; or an inherently conductive polymer.

The particular curved lead configuration illustrated in FIG. 2 is merely illustrative. As described, for example, in the aforementioned '964 patent, as well as in co-pending, commonly assigned U.S. Pat. No. applications Ser. No. 08/927,601 now U.S. Pat. No. 5,859,472 and 08/712,855, the disclosures of which are incorporated by reference herein, various lead configurations can be used in processes such as those taught in the '964 patent. Also, as described in certain preferred aspects of U.S. Pat. No. 5,798,286, the disclosure of which is incorporated by reference herein, similar processes can be performed using arrays of individual semiconductor chips which are bonded to leads on a single support structure so that the leads associated with all of the separate chips can be deformed in a single operation. These teachings can be applied in conjunction with the present invention.

Figure 6:
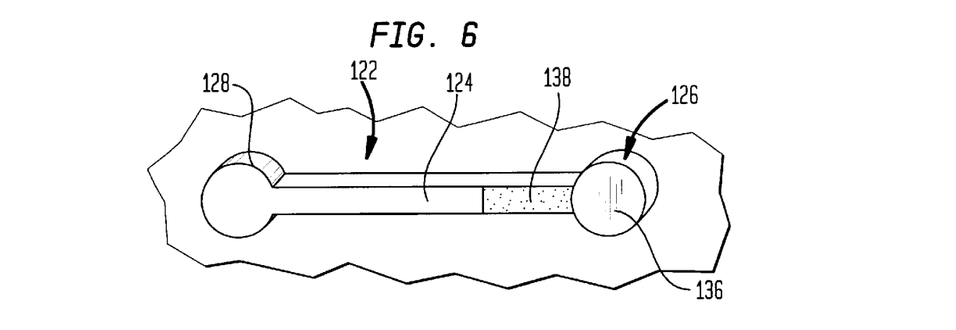
FIG. 6 is a fragmentary diagrammatic perspective view of a component according to a further embodiment.

The non-wettable surface of a lead need not be provided on all areas of the lead other than the tip region. For example, the lead 122 depicted in FIG. 6 has an anchor end 128, elongated main portion 124 and tip end 126 similar to the corresponding components of the leads depicted in FIGS. 1–5. Here again, a wettable surface 136 is provided in a tip region of the lead, on the tip end. A non-wettable surface 138 is provided only in a relatively small portion of the main region 124, adjacent the tip region. The remaining regions of the lead surface may be wettable by the bonding material or else may have unpredictable surface characteristics and unpredictable wettability resulting from uncontrolled interactions with the environment. However, because the non-wettable surface 138 bounds the wettable surface 136 at the juncture between the tip end 126 and the main regions of the lead, the non-wettable surface will confine the liquid bonding material and prevent the liquid bonding material from spreading along the length of the lead.

Figure 7:
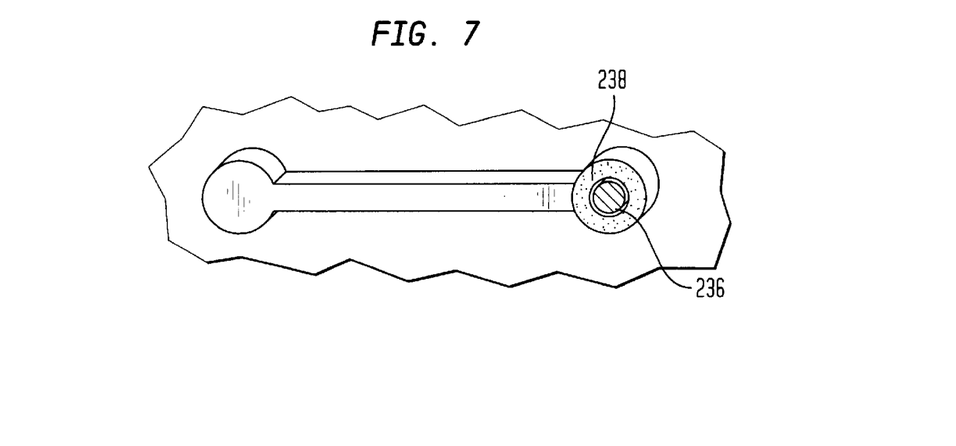
FIG. 7 is a view similar to FIG. 6 but depicting a component according to a further embodiment of the invention during an assembly process.

As depicted in FIG. 7, a non-wettable surface may be provided as a closed loop like region surrounding the wettable surface 236. While this configuration is effective to confine the liquid bonding material, it typically requires a relatively large lead tip. Certain preferred embodiments of co-pending, commonly assigned U.S. Pat. No. application Ser. No. 047,638, filed Mar. 25, 1998, the disclosure of which is also incorporated by reference herein, disclose solder pads disposed on the surface of a dielectric element. These solder pads and the adjacent conductive features include non-wettable materials for confining the solder and, in some cases, for forming the solder mass into certain desired configurations. Configurations of non-wettable materials as taught in the '638 application can be provided on the lead tips in accordance with this invention.

In the processes discussed above, the bonding material is provided as a unitary drop of liquid bonding material at each joint, as for example, as a mass of molten solder or a mass of a liquid eutectic. However, the bonding material may incorporate one or more solid particles. For example, the bonding material may be provided as a mass of solder having an embedded metallic core such as a copper or nickel sphere. Such a mass is commonly preferred to as a "solid core solder ball". The core remains in place between the elements to be bonded. Use of a solid core is best suited to assemblies having relatively large lead tips. Also, with a solid-core solder ball, the volume of solder is reduced. This minimizes the amount of tin present at the joint, and hence makes it more difficult to keep the gold content of the joint low relative to the solder volume as, for example, below 5% of the solder volume.

Figure 8:
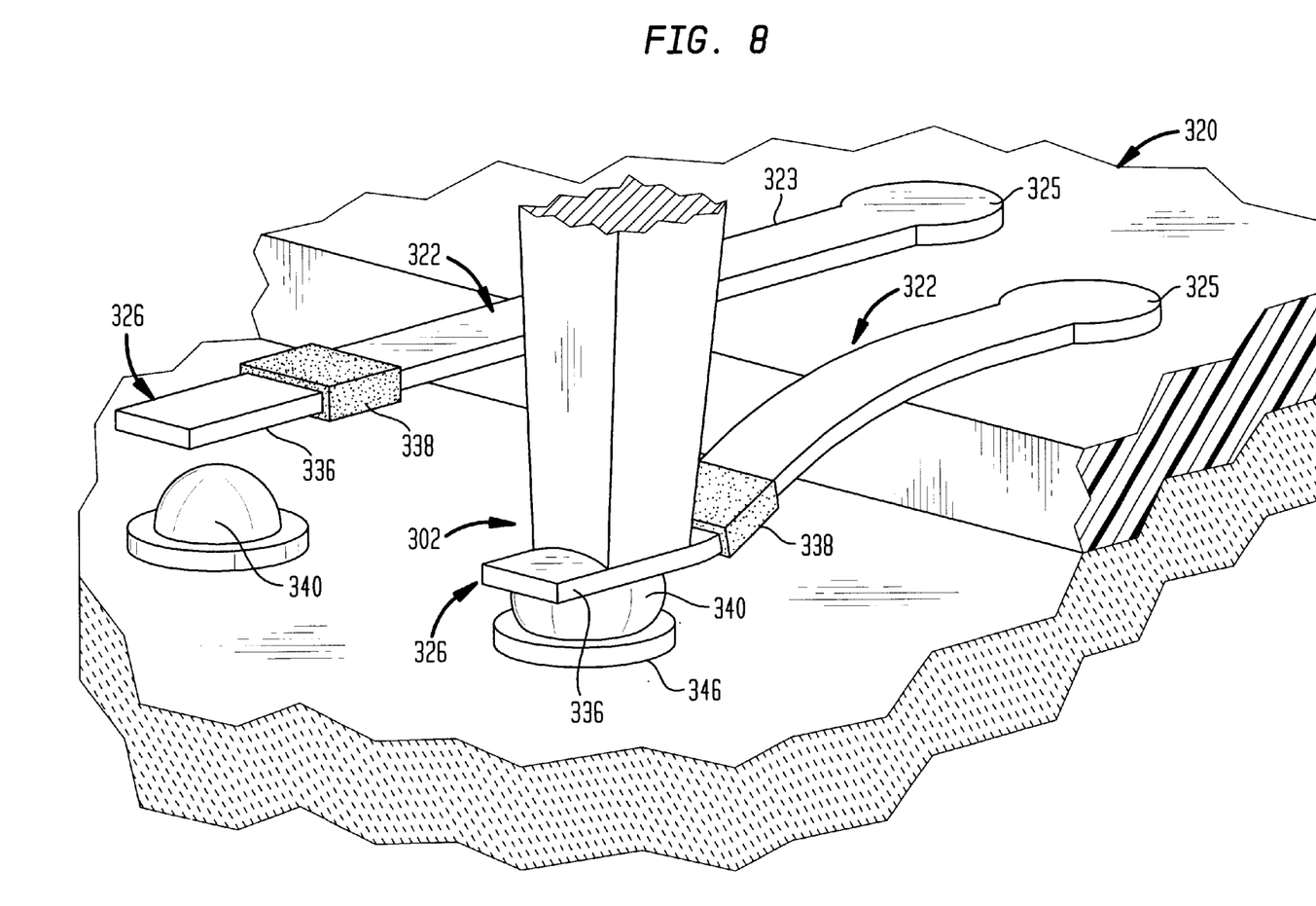
FIG. 8 is a fragmentary perspective view depicting a component in accordance with a further embodiment of the invention.

In the processes discussed above, numerous leads are bonded simultaneously. However, the present invention also may be employed in processes where leads are bonded individually. For example, as shown in FIG. 8, a tape automated bonding ("TAB") tape includes a dielectric support structure 320 with leads 322 formed integrally with metallic traces 323 terminating in contact pads 325. Each lead has a tip end 326 remote from the support structure. Each lead is provided with a wettable surface in a tip region 336 at the tip end. The wettable surface may extend on all surfaces of the lead at the tip end or may be provided only on the bottom or downwardly-facing surface of the lead tip. Each lead also has a nonwettable surface 338 bounding the wettable surface 336. As illustrated in FIG. 8, the non-wettable surface extends entirely around the lead. However, the non-wettable surface may be provided only on the downwardly facing surface of the lead. Also, as set forth above, the non-wettable surface may extend over a greater portion of the lead and may extend onto traces 323 as well. However, where contact pads 325 are to be connected to other structures by soldering liquid bonding operations, the non-wettable surface desirably does not extend onto the contact pads 325.

In the bonding operation, the tab tape is engaged with a semiconductor chip or other microelectronic device having contacts 346. the contacts 346 bear masses of a solder or other liquifiable bonding material 340. A bonder tool 302 is engaged with each lead. The bonder tool forces the lead into engagement with the solder mass and momentarily heats lead and solder mass so as to liquefy the solder mass 340 and thereby provide a liquid bonding material at the tip regions of the lead. The liquid bond material solidifies whereupon the tool is removed and advanced to the next lead. Desirably, the bonder tool has a non-wettable surface. The bonder tool may apply heat directly by conduction, by application of sonic or ultrasonic energy or both. Alternatively or additionally, radiant energy may be focused onto the masses of bonding material to provide heat. In a variant of this approach, the lead tips, rather than the contacts on the device, may be provided with the solder or other bonding material.

Figure 9:
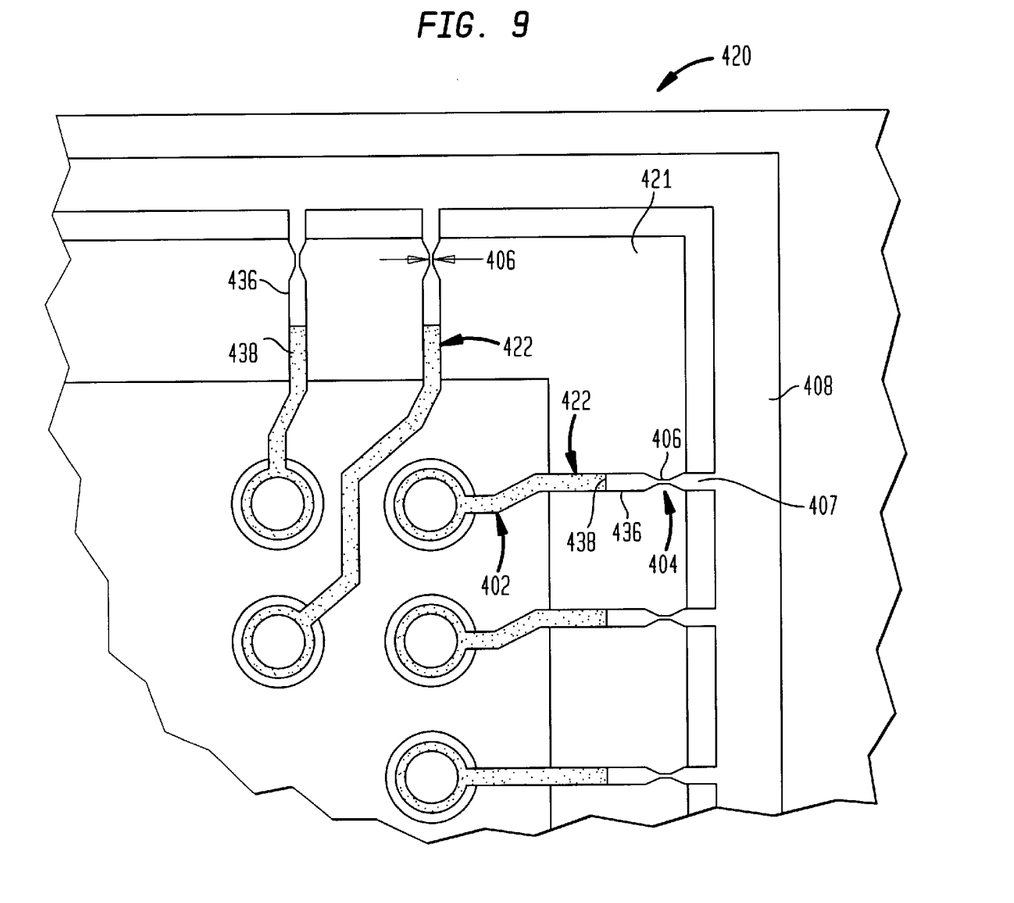
FIG. 9 is a fragmentary bottom plan view of a component according to yet another embodiment of the invention.

The present invention may also be applied in conjunction with connection components and methods described in PCT publication WO94/03036; U.S. Pat. No. 489,749; U.S. Pat. No. 5,491,82 and U.S. Pat. No. 5,619,017, the disclosures of which are hereby incorporated by reference herein. As shown in certain embodiments of these patents and publications, and as schematically shown in FIG. 9, a support structure 420 has a slot 421 or other aperture extending through it. Leads 422 extend across this slot. Each lead has a first end 402 permanently connected to the support structure and a second end 404 releasably connected to the support structure. In the particular structure depicted in FIG. 9, a bus bar 408 is mounted on the support structure along one side of slot 421. The second end of each lead is connected through a frangible element 406 and securement element 407 to the bus bar and support structure. Each lead has a wettable surface 436 adjacent the second end 404 and has a non-wettable surface 438 bounding the wettable surface.

In use, a bonding tool is engaged with each lead and advanced downwardly into the slot 421 so as to force the lead downwardly and break the frangible section, thereby detaching the second end of the lead from the support structure.

The tip or second end 404 is engaged and bonded in the manner discussed above with reference to FIG. 8. Here again, the non-wettable surface 438 confines the liquid bonding material and prevents the liquid bonding material from spreading along the lead, toward the first end 402. In the bonding process, the anchor elements 407 and bus bar 408 remain remote from the liquid bonding material. That is, these elements are not forced downwardly with the second ends 404 of the leads. Therefore, the surface characteristics of these elements are unimportant; they may have either a wettable surface or a non-wettable surface.

Figure 10:
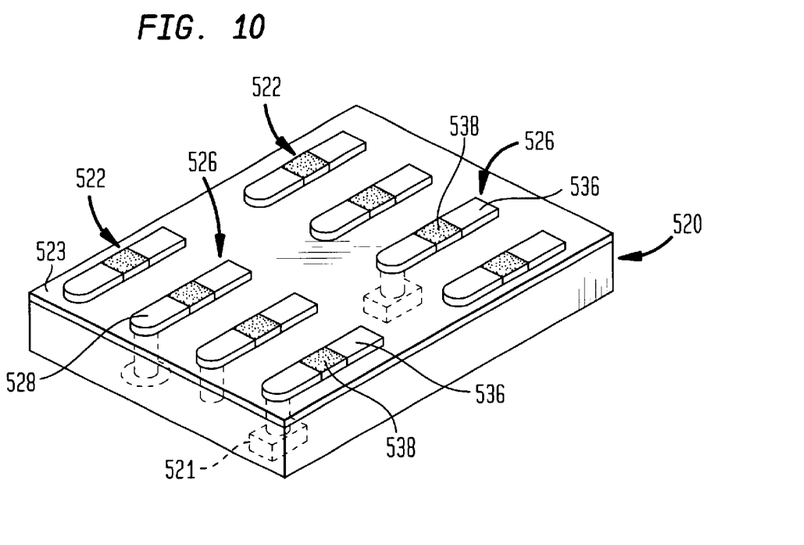
FIG. 10 is a diagrammatic perspective view of a component according to yet another aspect of the invention.

A component in accordance with a further embodiment of the invention (FIG. 10) has a support structure 520 which is a conventional semiconductor chip having active internal electronic devices 521, of which only a few are depicted in FIG. 10. The chip also has a conventional passivation layer 523 on an exposed, front surface. Leads 522 extend along the front surface, over the passivation layer. Each lead has a first end 528 permanently fastened to the chip and connected to internal devices 521 at openings (not shown) in passivation layer 523. Each lead also has a tip or second end 526 having a wettable region 536 on a surface of the tip facing away from the chip. The tip or second ends 526 of the leads are not permanently bonded to the chip. That is, the tip or second ends of the leads may simply overlie the passivation layer or may be releasably bonded to the passivation layer. Each lead also has non-wettable surface 538 bounding the wettable surface. The component may further include a bonding material (not shown) on the wettable surface regions 536. A component in accordance with this embodiment of this invention can be used by applying the chip onto another device to which the chip is to be connected, as for example, a circuit panel or another semiconductor chip. the tip ends of the leads can be bonded to exposed contacts on the other device in the same manner as discussed above with reference to FIGS. 4 and 5. Optionally, after bonding, the chip may be moved away from the other device so as to form vertically bent leads.

Figure 11:
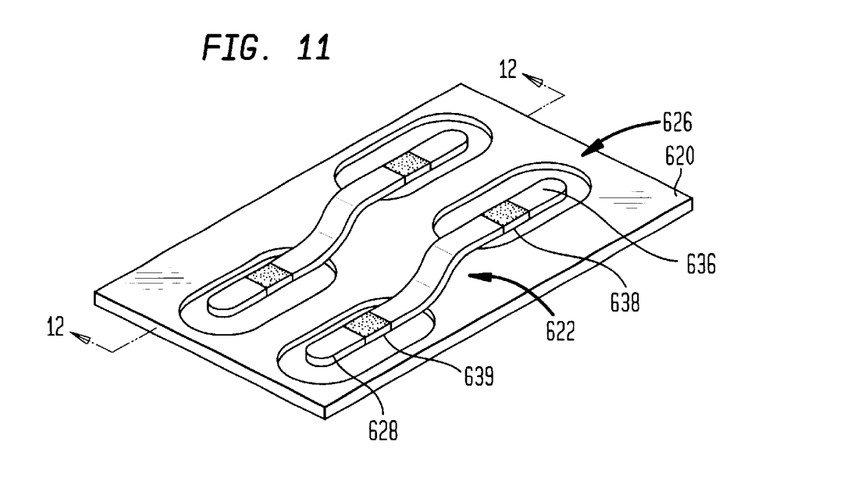
FIG. 11 is a diagrammatic perspective view of a component according to yet another embodiment of the invention.
Figure 12:
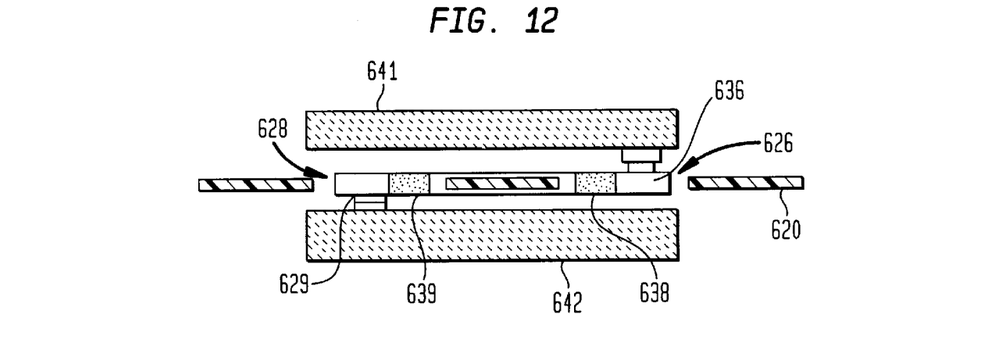
FIG. 12 is a sectional view taken along line 12—12 in FIG. 11, depicting the component in accordance with additional devices.

A component according to yet a further embodiment of the invention includes leads 622 mounted on a support 620. Each lead has a first end 628 and a second end 626. Each lead has an upwardly facing wettable surface 636 at its second end and a downwardly facing wettable surface 629 (FIG. 12) at its first end 628. Each lead is attached to the support between the first and second ends, but has the has the first and second ends detached from the support or releasably attached thereto. Leads 622 also have non-wettable regions 638 and 639 bounding the wettable areas. As shown in FIG. 12, a connection component with such double-end leads may be disposed between two electronic devices 641 and 642, and the wettable surface regions at the ends of the leads may be bonded to contacts on these devices. Thus, the wettable surface region 629 at the first end 628 of each lead is bonded to a contact on the device 642, whereas the wettable surface region 636 at the second end 626 of each lead is bonded to a contact on the opposite devices 641. Here again, the non-wettable surface regions serve to confine liquid bonding material. Optionally, components 641 and 642 may be moved away from one another so as to vertically bend leads 622 after bonding.

Figure 13:
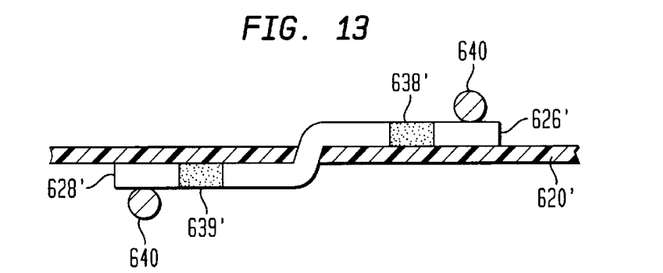
FIGS. 13 and 14 are fragmentary sectional views depicting components in accordance with still further embodiments of the invention.

A component according to yet another embodiment of the invention (FIG. 13) includes leads having first ends 628' and second ends 626' disposed on opposite sides of a sheet-like support 620'. Here again, each lead has wettable surface regions adjacent the first and second ends of the leads, and has non-wettable surface regions 638' and 639' bounding the wettable surface regions. The component depicted in FIG. 13 also has masses of bonding material 640 disposed on the wettable surface regions. A component in accordance with FIG. 13 may be used in the same manner as described above with reference to FIGS. 11 and 12.

Figure 14:
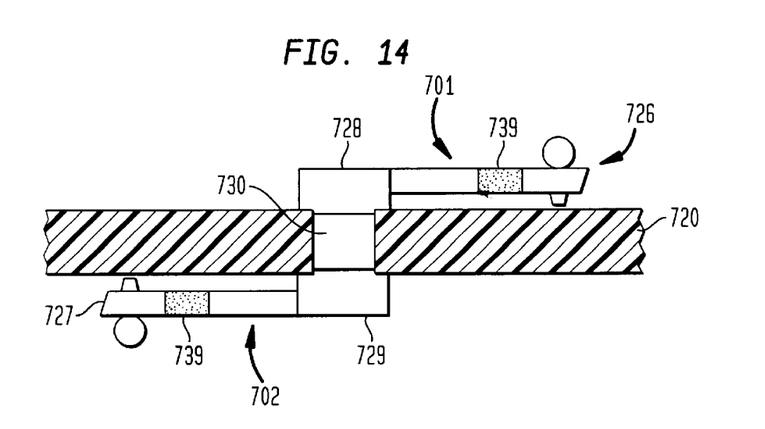

A component in accordance with yet another embodiment of the invention includes pairs of leads disposed on opposite sides of a support structure 720. Thus, each such pair includes a first lead 701 on the top surface and a second lead 702 on the bottom surface connected to one another by a via 730 extending through the support structure. Each lead 701 and 702 is essentially identical to one of the leads 22 discussed above with reference to FIGS. 1 and 2. Thus, each lead 701 has a first end 728 fixed to the support structure and a second tip or end 726 releasably connected to the support structure. Similarly, each lead 702 has a first end 729 fixed to the support structure and a second or tip end 727 releasably attached to the support structure. Components in accordance with FIG. 14 can also be used in substantially the same way as the component of FIGS. 11 and 12, to connect to electronic devices to one another. Here again, each lead has non-wettable surface areas 738 and 739 bounding a wettable surface area at or adjacent to the tip of such lead. In further variants of the embodiments illustrated in FIG. 14, the leads of each pair can be connected to one another by more complex arrangements of conductors extending through the support structure 720. Also, some or all of these leads can be connected to electrical elements such as traces or ground planes in or on the support structure.

Figure 15:
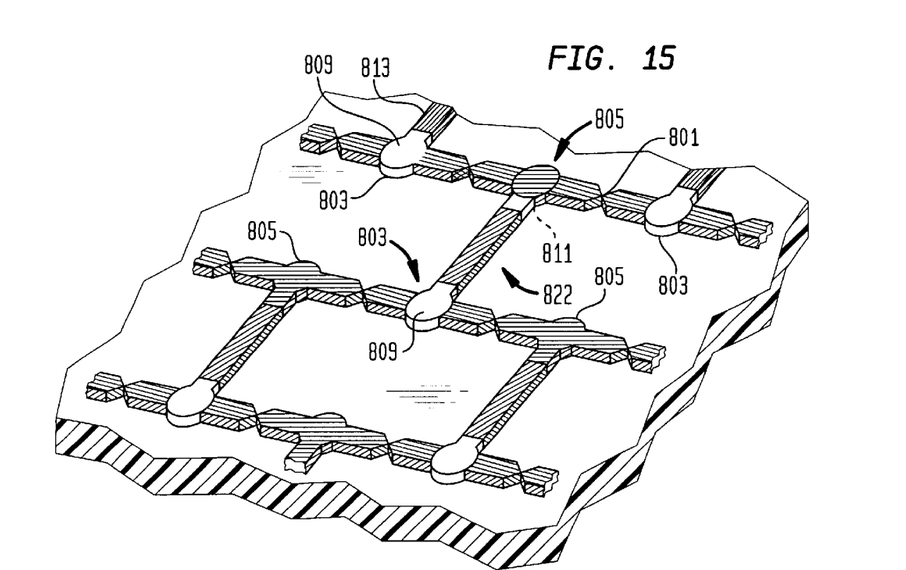
FIG. 15 is a fragmentary perspective view depicting a component according to yet another embodiment of the invention.

In the embodiments discussed above, the support structure serves to keep the leads in an array, so that the leads are disposed substantially at predetermined positions relative to one another. This facilitates engagement of the leads with electronic devices during use. In a further variant, the leads may be maintained in substantially predetermined positions relative to one another without the use of a separate support structure. Thus, as described in greater detail in copending, commonly assigned U.S. Pat. No. application Ser. No. 09/181,901, now U.S. Pat. No. 6,063,648, filed Oct. 29, 1998, the disclosure of which is incorporated by reference herein, leads 822 can be provided in a grid and interconnected with one another by frangible elements 801 (FIG. 15). Each lead 822 has a first end 803 and a second end 805. The leads are arranged so that the first end 803 of each lead is connected to the second ends 805 of adjoining leads by frangible elements 801. Each lead has a bondable, wettable surface region 809 facing upwardly at the first end and a similar, bondable and wettable surface region 811 facing downwardly at the second end. As described in greater detail in the '901 application, such a grid can be disposed between a pair of electronic devices. The upwardly facing first ends of the leads are bonded to contacts on one device, whereas the downwardly facing bondable regions 811 at the second ends 805 are bonded to contacts on the opposite device. The devices may then be moved away from one another, so that the second ends stay with one device whereas the first ends stay with the other device. The movement breaks the frangible sections 801 and also bends the leads to a vertically extensive configuration. In accordance with the present invention, such a grid may be provided with non-wettable surface regions bounding wettable surface regions 803 and 811. In the particular embodiments illustrated, the non-wettable surface regions 813 cover the entirety of the grid except at the wettable surface regions 809 and 811. In other embodiments, the non-wettable surface region may be provided only adjacent to the wettable surface regions. In the embodiment of FIG. 15, the frangible interconnecting elements 801 serve to maintain the leads in position relative to one another without the use of a separate support structure.

As used in this disclosure, the term "wettable", used without qualification, or a statement that a surface or material is wettable by a bonding material refers to a material or surface which can be wet by the bonding material used in connection with the component. In those cases where a determination as to whether or not a material is wettable by a bonding material must be made in the absence of any particular bonding material specification, the termination should be based upon whether or not the surface or material will be wet by any lead-tin solder. If so, the surface or material should be considered wettable by a bonding material.

As these and other variations and combinations of the features discussed above may be utilized without departing from the present invention as defined by the claims, the foregoing discussion of the preferred embodiments should be taken by way illustration rather than by way of limitation of the invention as defined by the claims.

What is claimed is:

1. A method of making a structure having leads thereon, comprising:

(a) providing a support structure with leads thereon, each said lead including a structure incorporating a structural metal, each said lead including a first end and a tip end remote from said first end, the tip end being movable with respect to said support structure, each said lead including a main region between said ends;

(b) treating said leads so as to provide first surfaces wettable by a liquid bonding material in tip regions of the leads adjacent the tip ends thereof and so as to provide a second surface which is not wettable by said liquid bonding material bounding said first surfaces at least at the juncture of the tip region of each lead and the main region thereof, including directly or indirectly exposing said structural metal to a reactant selected from the group consisting of nitrogen and a halogen.

2. A method as claimed in claim 1 further comprising applying a bonding material to said tip regions having said wettable surface, said bonding material being adapted to form a liquid phase which wets said wettable surfaces but does not wet said non-wettable surfaces.

3. A method of making a structure having leads thereon, comprising:

(a) providing a support structure with leads thereon, each said lead including a structure incorporating a structural metal, each said lead including a first end and a tip end remote from said first end, the tip end being movable with respect to said support structure, each said lead including a main region between said ends; and (b) treating said leads so as to provide surfaces wettable by a liquid bonding material in tip regions of the leads adjacent the tip ends thereof and so as to provide a surface which is not wettable by said liquid bonding material bounding said wettable surface at least at the juncture of the tip region of each lead and the main region thereof;

(c) said treating including directly or indirectly exposing said main regions of said lead structures with one or more reactants selected from the group consisting of nitrogen and a halogen so that said one or more reactants react with one or more of said structural metals to form said surface layer.

4. A method as claimed in claim 3 further comprising applying a cover layer on said tip regions prior to said contacting, said cover layer being substantially non-reactive with said reactant during said exposing.

5. A method as claimed in claim 4 wherein said cover layer is electrically conductive and remains on said tip region after said exposing.

6. A method as claimed in claim 2 wherein said structural metal includes copper or a copper alloy.

7. A method of making an electronic connection comprising:

(a) providing one or more leads having tip ends and forming a non-wettable surface bounding said tip ends including directly or indirectly exposing said leads to a reactant selected from the group consisting of nitrogen and halogen;

(a) engaging said tip ends of said one or more leads with one or more contacts on a first electronic device;

(b) providing a liquid bonding material at the engaged tip ends and contacts, said liquid bonding material wetting said tip ends of said leads and said contacts, said non-wettable surface on said leads confining said liquid bonding material and preventing said liquid bonding material from spreading along said leads; and then (c) solidifying the liquid bonding material so as to form permanent bonds between the tip ends and contacts.

8. A method as claimed in claim 7 wherein said one or more leads includes a plurality of leads, said engaging said tip ends of said leads with said contacts including juxtaposing an array of said leads with said electronic device so as to juxtapose said tip regions of said plural leads with said contacts.

9. A method as claimed in claim 8 wherein said providing a liquid bonding material is performed simultaneously for said plurality of leads.

10. A method as claimed in claim 9 wherein said leads extend along a bottom surface of a support structure, each said lead having an anchor end permanently attached to said support structure and having its tip end releasably attached to said support structure, the method further comprising moving said support structure away from said electronic device after said solidifying so as to bend said leads to a vertically-extensive disposition.

11. A method as claimed in claim 8 further comprising bonding ends of said leads remote from said tip ends to a second electronic device, and moving said second electronic device away from said first electronic device so as to bend the leads to a vertically-extensive disposition.

12. A method as claimed in claim 8 wherein said providing a liquid bonding material includes providing masses of a solid bonding material at the tip ends of said leads prior to said juxtaposing step and heating the solid bonding material while said tip ends are engaged with the contacts.

13. A method as claimed in claim 8 wherein said providing a liquid bonding material includes providing masses of a solid bonding material on said contacts prior to said juxtaposing and heating the solid bonding material while said tip ends are engaged with the contacts.

14. A method of making a structure having leads thereon, comprising:

(a) providing a support structure with leads thereon, each said lead including a structure incorporating a structural metal, each said lead including a first end and a tip end remote from said first end, the tip end being movable with respect to said support structure, each said lead including a main region between said ends;

(b) treating said leads so as to provide first surfaces wettable by a liquid bonding material in tip regions of the leads adjacent the tip ends thereof and so as to provide a second surface which is not wettable by said liquid bonding material bounding said first surfaces at least at the juncture of the tip region of each lead and the main region thereof, including depositing a layer of material selected from the group consisting of metal nitride and metal halide.

15. A method of making a structure having leads thereon, comprising:

(a) providing a support structure with leads thereon, each said lead including a structure incorporating a structural metal, each said lead including a first end and a tip end remote from said first end, the tip end being movable with respect to said support structure, each said lead including a main region between said ends;

(b) treating said leads so as to provide first surfaces wettable by a liquid bonding material in tip regions of the leads adjacent the tip ends thereof and so as to provide a second surface which is not wettable by said liquid bonding material bounding said first surfaces at least at the juncture of the tip region of each lead and the main region thereof, including directly or indirectly exposing said structural metal to a plasma.

16. The method of claim 15 wherein said plasma contains a material selected from the group consisting of oxygen and nitrogen.

17. A method of making an electronic connection comprising:

(a) providing one or more leads having tip ends and forming a non-wettable surface bounding said tip ends including directly or indirectly exposing said leads to a plasma;

(b) engaging said tip ends of said one or more leads with one or more contacts on a first electronic device;

(c) providing a liquid bonding material at the engaged tip ends and contacts, said liquid bonding material wetting said tip ends of said leads and said contacts, said non-wettable surface on said leads confining said liquid bonding material and preventing said liquid bonding material from spreading along said leads; and then (d) solidifying the liquid bonding material so as to form permanent bonds between the tip ends and contacts.

18. A method of making an electronic connection comprising:

(a) providing one or more leads having tip ends and forming a non-wettable surface bounding said tip ends including directly or indirectly exposing said leads to a reactant selected from the group consisting of metal nitride and metal halide;

(b) engaging said tip ends of said one or more leads with one or more contacts on a first electronic device;

(c) providing a liquid bonding material at the engaged tip ends and contacts, said liquid bonding material wetting said tip ends of said leads and said contacts, said non-wettable surface on said leads confining said liquid bonding material and preventing said liquid bonding material from spreading along said leads; and then (d) solidifying the liquid bonding material so as to form permanent bonds between the tip ends and contacts.

* * * * *

UNITED STATES PATENT AND TRADEMARK OFFICE
CERTIFICATE OF CORRECTION

PATENT NO. : 6,378,758 B1
DATED : April 30, 2002
INVENTOR(S) : Belgacem Haba

It is certified that error appears in the above-identified patent and that said Letters Patent is hereby corrected as shown below:

Column 4,
Line 7, "nonwettable" should read -- non-wettable --.

Column 15,
Line 21, "claim 2" should read -- claim 3 --.

Signed and Sealed this

Fifteenth Day of October, 2002

Attest:

Attesting Officer

JAMES E. ROGAN
*Director of the United States Patent and Trademark Office*